US008889218B2

(12) United States Patent
Eberle et al.

(10) Patent No.: US 8,889,218 B2
(45) Date of Patent: Nov. 18, 2014

(54) FOAM WINDOW MOUNT HAVING AN ELECTRIC CONDUCTIVE LAYER OVER A LIGHT BLOCKING LAYER

(75) Inventors: Joseph Cole Eberle, Seattle, WA (US); Jeffrey B. Masiwchuk, Kirkland, WA (US); Mitchell V. Bruce, Wheeling, WV (US); Brian L. Smith, Brunswick, OH (US); Thomas R. Scarniac, Avon, OH (US)

(73) Assignee: PPG Industries Ohio, Inc., Cleveland, OH (US)

( * ) Notice: Subject to any disclaimer, the term of this patent is extended or adjusted under 35 U.S.C. 154(b) by 295 days.

(21) Appl. No.: 13/462,005

(22) Filed: May 2, 2012

(65) Prior Publication Data

US 2012/0217346 A1 Aug. 30, 2012

Related U.S. Application Data

(60) Continuation-in-part of application No. 13/352,456, filed on Jan. 19, 2012, now Pat. No. 8,313,817, which is a division of application No. 12/402,709, filed on Mar. 12, 2009, now Pat. No. 8,105,645.

(51) Int. Cl.
*B05B 15/04* (2006.01)
*H05K 9/00* (2006.01)
*B64C 1/14* (2006.01)

(52) U.S. Cl.
CPC .......... *B05B 15/0462* (2013.01); *H05K 9/0005* (2013.01); *B64C 1/1492* (2013.01)
USPC ........................... 427/123; 427/58; 427/126.1

(58) Field of Classification Search
CPC . B05B 15/0462; B64C 1/1492; H05K 9/0005
USPC ........................................................ 427/126.1
See application file for complete search history.

(56) References Cited

U.S. PATENT DOCUMENTS

| 4,610,771 A | 9/1986 | Gillery |
| 4,720,350 A | 1/1988 | Zoleski et al. |
| 4,806,220 A | 2/1989 | Finley |
| 5,215,821 A | 6/1993 | Ho |
| 5,675,944 A | 10/1997 | Kerr et al. |
| 5,821,001 A | 10/1998 | Arbab et al. |
| 5,973,039 A | 10/1999 | Florent et al. |
| 6,471,360 B2 | 10/2002 | Rukavina et al. |
| 6,783,099 B2 | 8/2004 | Rukavina et al. |
| 6,787,204 B2 | 9/2004 | Chaussade et al. |

(Continued)

FOREIGN PATENT DOCUMENTS

| DE | 199 13 799 C1 | 1/2001 |
| EP | 1 478 106 A2 | 11/2004 |

*Primary Examiner* — Alexander Weddle
(74) *Attorney, Agent, or Firm* — Andrew C. Siminerio

(57) ABSTRACT

A foam mount has a shape of an enclosed frame surrounding an open area, the frame in cross section having a peripheral surface; an inside surface opposite to the peripheral surface, the inside surface defining the open area. The inside surface includes a groove having an open end and the open end of the groove faces the open area of the foam mount. A coating is applied over selected surfaces of the foam mount, wherein the coating has a visible light transmission of less than 15%. Also disclosed is a method of coating an electric conductive coating over the visible light blocking coating and a decorative coating over selected surfaces of the foam mount.

25 Claims, 6 Drawing Sheets

(56) References Cited

U.S. PATENT DOCUMENTS

| | | |
|---|---|---|
| 7,393,101 B2 | 7/2008 | Blum et al. |
| 7,586,664 B2 | 9/2009 | O'Shaughnessy |
| 8,105,645 B2 | 1/2012 | Bruce et al. |
| 2006/0145006 A1* | 7/2006 | Drost .......................... 244/118.5 |
| 2006/0196095 A1* | 9/2006 | Flannigan ........................ 40/757 |
| 2007/0137117 A1* | 6/2007 | Carlson et al. ................ 52/204.1 |
| 2007/0155946 A1* | 7/2007 | Berti et al. .................... 528/272 |

* cited by examiner

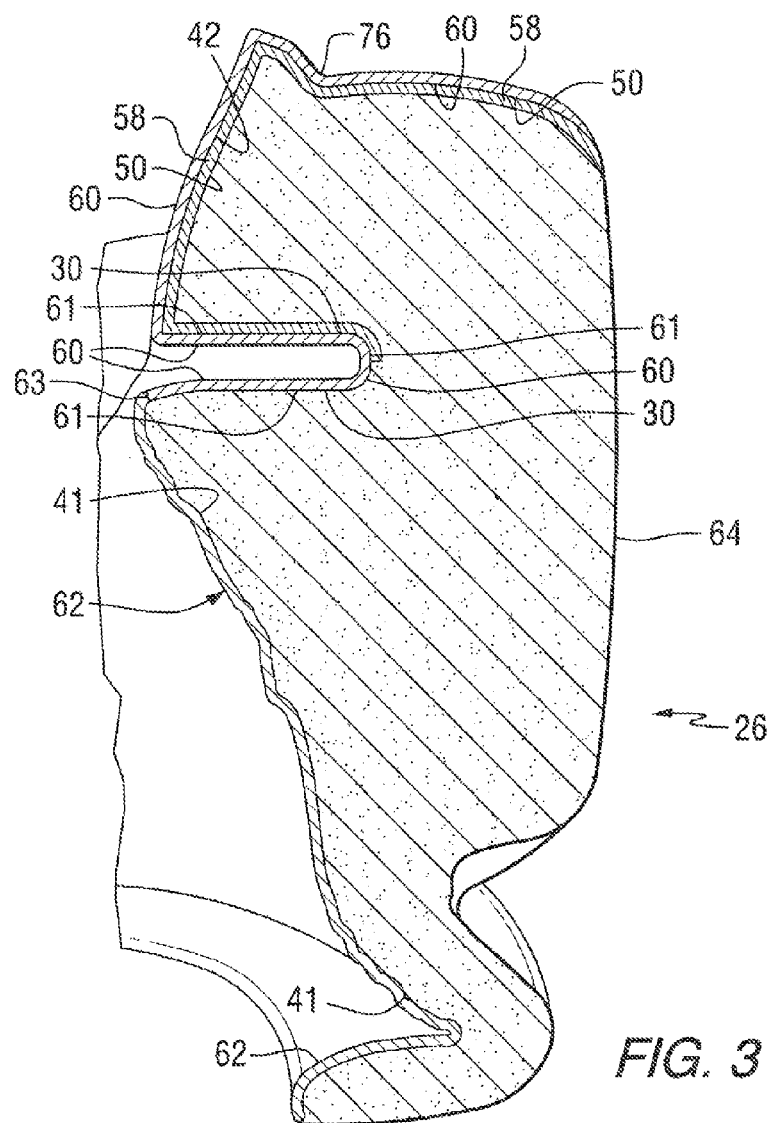
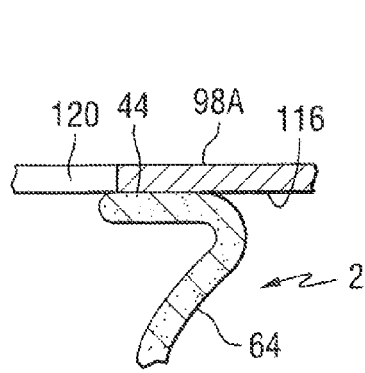
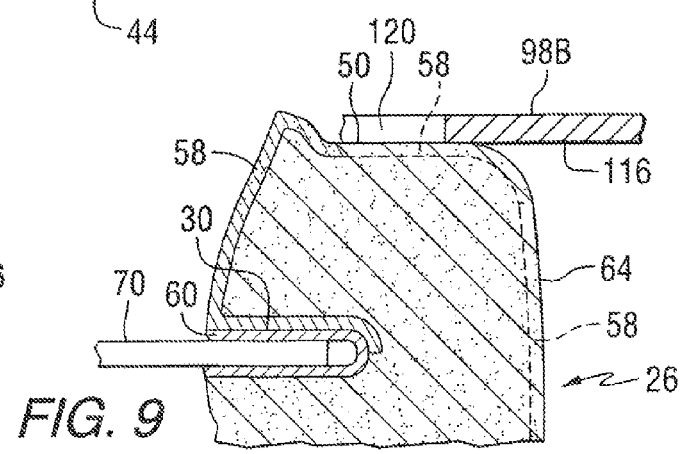
FIG. 3
FIG. 8
FIG. 9 ized application of U.S. patent application Ser. No. 13/352,456 filed on Jan. 18, 2012 in the names of Mitchell V. Bruce, Brian L. Smith and Thomas R. Scarniac and titled Method of Applying an Electric Conductive Layer to Selected Portions of a Mounting Frame, now U.S. Pat. No. 8,313,817, which application is a divisional application of U.S. patent application Ser. No. 12/402,709 filed on Mar. 12, 2009 in the names of Mitchell V. Bruce, Brian L. Smith and Thomas R. Scarniac and titled Method of Applying an Electric Conductive Layer to Selected Portions of a Mounting Frame, now U.S. Pat. No. 8,105,645. U.S. patent application Ser. No. 13/352,456 and U.S. Pat. No. 8,105,645 in their entirety are hereby incorporated by reference.

FOAM WINDOW MOUNT HAVING AN ELECTRIC CONDUCTIVE LAYER OVER A LIGHT BLOCKING LAYER

CROSS REFERENCE TO RELATED APPLICATIONS

This application is a continuation-in-part application of U.S. patent application Ser. No. 13/352,456 filed on Jan. 18, 2012 in the names of Mitchell V. Bruce, Brian L. Smith and Thomas R. Scarniac and titled Method of Applying an Electric Conductive Layer to Selected Portions of a Mounting Frame, now U.S. Pat. No. 8,313,817, which application is a divisional application of U.S. patent application Ser. No. 12/402,709 filed on Mar. 12, 2009 in the names of Mitchell V. Bruce, Brian L. Smith and Thomas R. Scarniac and titled Method of Applying an Electric Conductive Layer to Selected Portions of a Mounting Frame, now U.S. Pat. No. 8,105,645. U.S. patent application Ser. No. 13/352,456 and U.S. Pat. No. 8,105,645 in their entirety are hereby incorporated by reference.

BACKGROUND OF THE INVENTION

1. Field of the Invention

This invention relates to a foam it mount having an electric conductive layer over a light blocking layer or coating, and method of applying same to the foam window mount, and more particularly, to a foam window mount having an electric conductive coating over a light blocking layer having a visible light transmission of less than 40% and preferably zero percent over outer facing surfaces of the foam mount and a decorative layer or coating over inner surfaces of the foam mount, and methods of applying the layers.

2. Discussion of the Technical Problem

At the present time there is a desire to provide electronic shielding around the body of commercial aircrafts such that electronic signals to and from electronic equipment of the passengers, e.g. cell phones and computers within the commercial aircraft, are only transmitted by and received through the antenna of the aircraft. One of the advantages of this arrangement is the elimination of uncontrolled transmission of signals through the windows of the aircraft, which transmitted signals can interfere with transmitted signals required to operate the aircraft. As is appreciated by those skilled in the art, to attain this goal it becomes necessary to prevent transmission of the signals through the cabin windows and through the door windows of the aircraft.

In one approach to accomplish this goal, a window pane having an electric conductive layer is mounted in a foam mount, e.g. a foam window mount having an electric conductive layer. The window pane can be an electrochromic window, or one or more glass sheets having an electric conductive layer or film over the major surface of one or more of the sheets. More particularly and as is known in the art, the electrochromic window includes an electrochromic medium between two spaced electrodes. Each of the electrodes includes an electric conductive layer or film on a major surface of a glass sheet. The electric conductive layer or film provides a radio frequency ("RF") shielding.

The outboard surface of the foam mount has an electric conductive layer, e.g. an RF shielding layer or coating, and the inboard surface of the foam mount is coated with a non-electrical conductive decorative paint to compliment the decor of the aircraft interior. A detailed discussion for painting the foam mount with the electric conductive layer or coating and the non-electric conductive layer or coating is presented in U.S. Pat. No. 8,105,845.

The foam mount having the window pane is positioned in the window opening of the aircraft between an outboard structural ply and an inboard protective overlay sheet. The conductive layer on the foam mount is electrically connected with the aircraft body to connect the electric conductive layer of the foam mount to the electric ground of the aircraft. With this arrangement, the electric conductive layers of the electrochromic window and the electric conductive layer of the foam mount provide an RF shielding over the window opening hi the body of the aircraft.

Although the painting techniques disclosed in U.S. Pat. No. 8,105,645 are acceptable for applying two different coating layers on a foam mount, the coated foam mount has limitations. More particularly, the electric conductive layer and the non-electric conductive decorative layer is expected to have a visible light transmission of greater than 45%. The result is a portion of the visible light impinging on the electric conductive layer passes through the electric conductive layer, through the foam mount, and through the decorative layer. The foam mount transmits diffused light, i.e. the foam mount transmits visible light but causes sufficient diffusion of the visible light to prevent perception of distinct objects.

As can be appreciated by those skilled in the art, the foam mount passing diffused visible light is not decoratively acceptable, and is disruptive to the airline passengers. It would be advantageous, therefore, if visible light impinging on the electric conductive layer was prevented from passing through the foam mount.

SUMMARY OF THE INVENTION

This invention relates to a foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end and the open end of the groove faces the open area of the foam mount, and the first inner surface and the first side is on one side of the open end of the groove and the second inner surface and the second side is on the other side of the open end of the groove, the foam mount includes, among other things, a coating over selected surfaces of the foam mount, wherein the coating has a visible light transmission of less than 15%, and the selected surfaces of the foam mount includes at least the first inner surface of the foam mount.

This invention further relates to a radio frequency (hereinafter designated as "RF") shielded window, including, among other things, a foam mount in a shape having an enclosed frame surrounding an open area, the frame in cross section having a peripheral surface; an inside surface opposite to the peripheral surface, wherein the inside surface defines the open area and the inside surface of the foam mount includes a groove having an open end and the open end of the groove facing the open area of the foam mount; a first side of the foam mount extending from the peripheral surface to a first inner surface, and an opposite second side of the foam mount extending from the peripheral surface to a second inner surface, wherein the first inner surface and the first side are on one side of the open end of the groove and the second inner surface and the second side are on the other side of the open end of the groove. A coating is over selected surfaces of the foam mount, wherein the coating has a visible light transmission of less than 15%, and the selected surfaces of the foam mount include, among other things, at feast the first inner surface, and the first side, of the foam mount. An electric conductive coating is over selected portions of the visible light blocking coating and over the inner was of the groove, and the first side and the first inner surface of the foam mount, and a non-electric conductive coating is over the second side and the second inner surface of the foam mount. A window has a radio frequency shielding electrically conductive coating defined as an RF coating over a major surface of the window, wherein marginal edges of the window are in the groove with the RF coating of the window in electrical contact with the electric conductive coating in the groove.

Still further, this invention relates to a method of coating a foam mount, the foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end with the open end of the groove facing the open area of the foam mount, and the first inner surface and the first side are on one side of the open end of the groove and the second inner surface and the second side are on the other side of the open end of the groove. The method includes, among other things, applying a visible light blocking coating over selected surfaces of the foam mount, wherein the visible light blocking coating has a visible light transmission of less than 15%, and the selected surfaces include at least the first inner surface of the foam mount.

In addition, this invention relates to a method of making an RF shielded aircraft window, the method includes, among other things, providing a foam mount, the foam mount in a shape having an enclosed frame surrounding an open area. The frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes open end of a groove facing the open area of the foam mount and the first inner surface is on one side of the open end of the groove and the second inner surface is on the other side of the open end of the groove. A transparency having an electric conductive layer over a major surface the transparency and a blank are provided. The transparency is shaped and sized to fit within the groove of the foam mount and completely cover the open area of the foam mount, and the blank has a peripheral shape similar to peripheral shape of the transparency. A visible light blocking coating is provided over selected surfaces of the foam mount, wherein the coating has a visible light transmission of less than 15%, and the selected surfaces include, among other things, at least the first inner surface and the first side, of the foam mount. After the visible light blocking coating is applied to the foam mount, a first electric conductive coating is applied over inner surface of the groove. The peripheral edge of the blank is inserted in the groove to completely cover the open area of the foam mount to separate the foam mount into a first section and a second section, wherein the first section includes, among other things, the first side and the first inner surface, and the second half includes, among other things, the second side and the second inner surface; applying a second electric conductive coating over the first section, wherein the second coating on the first section of the foam mount and the first coating on the inner surface of the groove contact one another. A non-electric conductive coating is applied over the second section of the foam mount. The blank is removed from the foam mount, and the transparency in placed in the groove of foam mount.

BRIEF DESCRIPTION OF THE DRAWINGS

FIG. 3 is a cross sectional view of the foam mount shown in FIG. 2.

FIG. 8 is a fragmented side view of one non-limited embodiment of a mask cover on one side of the foam mount in accordance to the teachings of the invention.

FIG. 9 is a view similar to the view of FIG. 8 showing another non-limited embodiment of a mask cover on the other side of the foam mount in accordance to the teachings of the invention.

DESCRIPTION OF THE INVENTION

Figure 1:
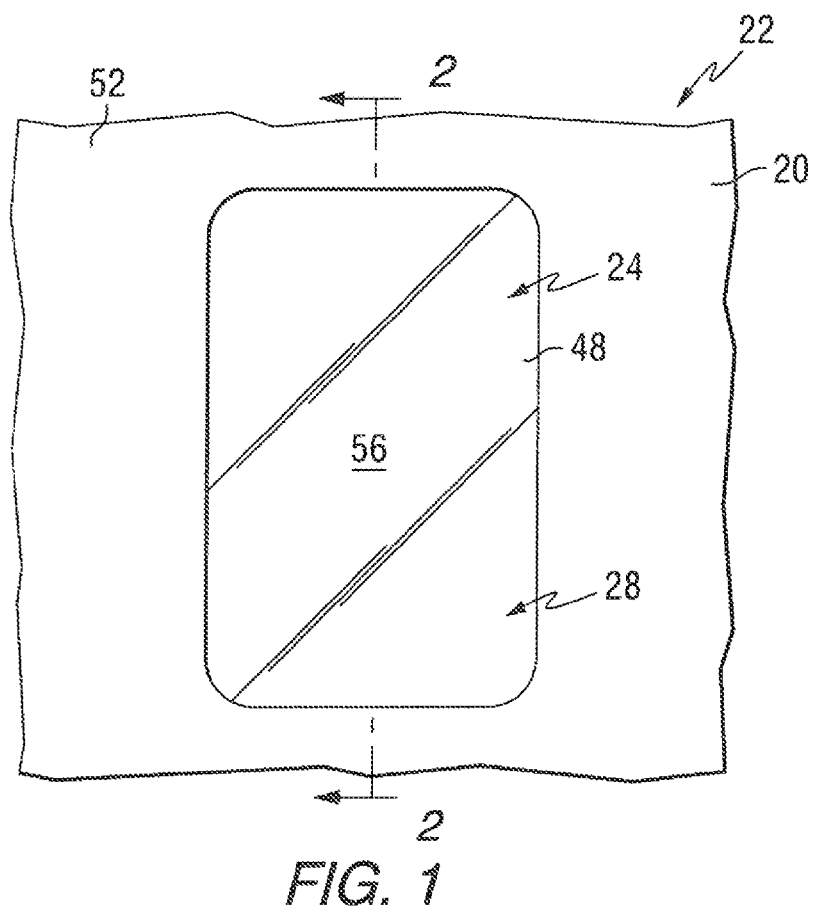
FIG. 1 is a fragmented side view of an aircraft showing outboard view of a cabin window.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the terms "sprayed over", "provided over", or "applied over" mean sprayed, provided, or applied, on but not necessarily in surface contact with. For example, a material "applied over" a substrate, e.g. but not limited to a foam mount, does not preclude the presence of one or more other materials of the same or different composition located between the deposited material and the substrate.

Before discussing non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise in the following discussion, like numbers refer to like elements.

Non-limiting embodiments of the invention will be directed to the practice of the invention to make a cabin window of an aircraft; the invention, however, is not limited to any particular type of aircraft cabin window, and the invention contemplates the practice of the invention on door windows of an aircraft. Further, the invention can be practiced on windows for commercial and residential buildings, e.g. but not limited to type disclosed in U.S. Pat. No. 5,675,944, which patent in its entirety is hereby incorporated by reference; on windows for any type of vehicle; e.g. air and space vehicles, and above or below water vessels, and on windows for viewing through a side or door of any type of containers, for example but not limited to a refrigerator, cabinet and/or oven door.

Figure 2:
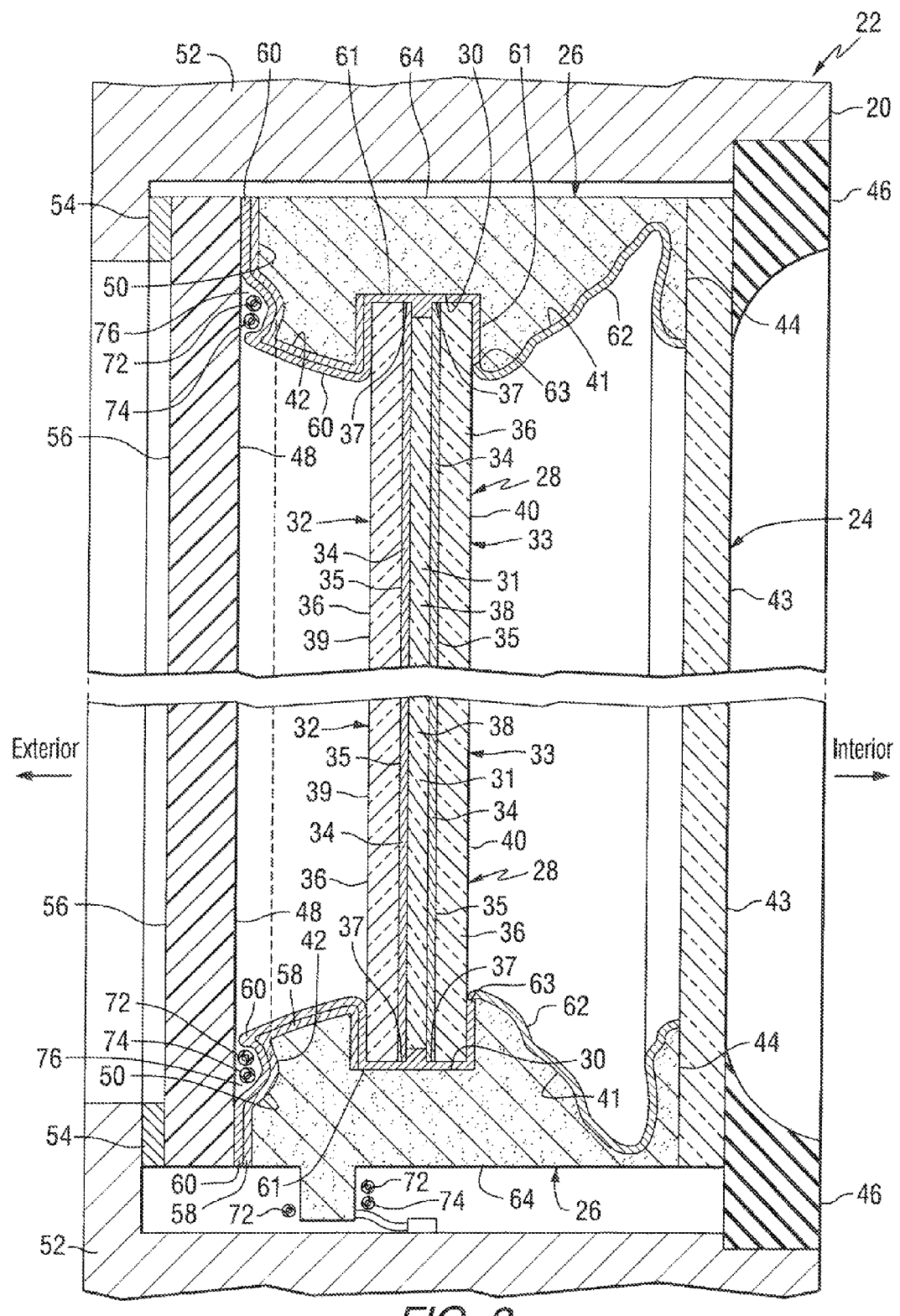
FIG. 2 is a view taken along lines 2-2 of FIG. 1.

With reference to FIGS. 1 and 2 as needed, a section 20 of an aircraft 22 has a cabin window 24. The cabin window 24 (see FIG. 2) includes a frame mount 26, which includes features of the invention and is coated according to the invention. In the preferred practice of the invention the frame mount 26 is made of foam and will hereinafter also be referred to as "frame mount" or "foam mount." A window or pane 28, e.g. an electrochromic window 28 is mounted in a groove 30 of the foam mount 26. The electrochromic window 28 includes an electrochromic medium 31 between a pair of electrodes 32 and 33. Each of the electrodes 32 and 33 includes an electric conductive layer or film 34 on inner surface 35 of a glass sheet 36. The marginal edges 37 of the sheets 36 of the electrodes 32 and 33 are sealed to provide a sealed cell 38 having the electrochromic medium 31. Outer surface 39 of the glass sheet 36 of the electrode 32 faces the exterior of the aircraft 22, and outer surface 40 of the glass sheet 36 of the electrode 33 faces the interior of the aircraft 22. Electrochromic windows 28 are well known in the art and no further discussion of the construction of the electrochromic window 28 is deemed necessary.

The electro conductive film 34 of the electrodes 32 and 33 provides an RF shielding to prevent transmission of electric signals through the pane 28. The inboard inner surface 41 of the foam mount 26 faces the interior of the aircraft 22, and outboard inner surface 42 of the foam mount 26 faces the exterior of the aircraft 22. An inboard protective overlay sheet 43 is between inboard side 44 of the foam mount 26 and interior window frame 46, and a structural ply 48 is between outboard side 50 of the foam mount 26 and body 52 of the aircraft 22. Optionally a gasket 54 is provided between outboard surface 56 of the structural ply 48 and the body 52 of the aircraft 22 to minimize, if not eliminate, the ingress of moisture between the aircraft body 52 and the structural ply 48.

The invention is not limited to the manner in which, or the components used, to securely mount the cabin window 24 in the aircraft body 52, and any of the techniques or fasteners, e.g. bolts, nuts, screws, dips and latches known in the art can be used in the practice of the invention to secure the cabin window 24 to the aircraft body 52. As is appreciated by those skilled in the art, the manner of using the fasteners, and the type of fasteners used, to secure the cabin window to the aircraft body 52 is dictated by the designer and/or builder of the aircraft and is therefore not limiting to the invention. Further, the invention contemplates unitizing the components of the cabin window, e.g. the structural ply 48, the foam mount 26 having the pane 28, and the overlay sheet 43, and securing the unitized cabin window in the aircraft body 52, and thereafter securing the inboard window frame 46 to the aircraft body. The invention also contemplates individually mounting and securing the components of the cabin window 24 in the aircraft body 52, e.g. securing the structural ply 48 and gasket 54, if used, in position; securing the frame mount 26 having the pane 28 in position against the structural ply 48, and securing the overlay sheet 43 in position against the frame mount 26, and thereafter, securing the interior window frame 46 to the aircraft body.

The structural ply 48 is not limiting to the invention and can be a single glass or plastic sheet, or a pair of glass and plastic sheets, and combinations thereof laminated together by a interlayer material as is known in the art, e.g. as described in U.S. Pat. No. 7,586,664, which patent in its entirety is hereby incorporated by reference. When the sheets are made of glass, the glass is preferably chemically tempered, heat tempered or heat strengthen. The materials of the sheets and the number of sheets of the structural ply 48 are not limiting to the invention.

The inboard overly sheet 43 is not limiting to the invention and can be any of the types used in the art, e.g. a plastic sheet to protect the underlying pane 28 from surface scratches caused by passenger curiosity, cleaning solutions, and/or abrasive cleaning materials.

In the preferred practice of the invention, the pane 28 is an electrochromic device or window 28 having the electrochromic medium 31 changing percent of light transmission as a function of changes in voltage applied to the medium. The invention is not limited to the construction of the electrochromic window 28 and any of the types known in the art, e.g. U.S. Pat. Nos. 5,215,821; 6,471,360; 6,783,099 and 7,586,664 can be used in the practice of the invention. The invention also contemplates the pane 28 being a photochromic device having a pair of glass sheets spaced from one another and a medium between the sheets that changes percent of light transmission as a function of light intensity on the medium. The invention is not limited to the construction of the photo chromic window and any of the types known in the art, e.g. U.S. Pat. Nos. 4,720,350, 5,973,039 and 7,393,101 can be used in the practice of the invention. The invention further contemplates the pane 28 being a glass or plastic sheet, or one or more glass or plastic sheets or combinations thereof, laminated together or spaced from one another by a spacer frame, e.g. of the type disclosed in U.S. Pat. No. 5,675,944. The above mentioned patents in their entirety are hereby incorporated by reference.

As can now be appreciated by those skilled in the art, the invention contemplates the window 28 having an electric conductive layer or film on at least one of the major surfaces of the window to act as an RF shielding. For example and not limiting to the invention, in the instance when the window 28 is a photochromic window, an electric conductive layer or film is provided over or on the outer surface of a sheet, or the inner surface of a sheet, e.g. the surface 35 of the glass sheet 36 of the electrode 32 and/or 33.

In another non-limiting embodiment of the invention, the window 28 includes a substrate, e.g. a glass or plastic sheet having an electrically conductive layer or film over a major surface of the substrate. The electric conductive layer or film, e.g. the electric conductive film 34 of the electrodes 32 and 33 of the pane 28 (see FIG. 2) provides a barrier to the transmission of electronic signals, e.g. but not limited to signals received and transmitted by electronic equipment, e.g. but not limited to cell phones and wireless computers. The invention is not limited to the conductive film 34, and the film can be any of the types known in the art. Non-limiting embodiments of conductive films or coatings that can be used in the practice of the invention include, but are not limited to, a pyrolytic deposited fluorine doped tin oxide film of the type sold by PPG Industries, Inc. under the registered trademark "NESA"; a magnetron sputter deposited tin doped indium oxide film of the type sold by PPG Industries, Inc under the registered trademark "NESATRON"; a coating made up of one or more magnetron sputter deposited films, the films including, but not limited to a metal film, e.g. silver between metal oxide films (dielectric films), e.g. zinc oxide and/or zinc stannate, each of which can be applied sequentially by magnetron sputtering, e.g. as disclosed in U.S. Pat. Nos. 4,610,771; 4,806,220 and 5,821,001. The above mentioned patents in their entirety are hereby incorporated by reference.

As disclosed in U.S. Pat. No. 8,105,645, the foam mount 26 presently used to secure the window in position to the aircraft body is made of a material that is compressible, flexible and is electrically non-conductive. The material is compressible and flexible so that the pane 28 can be mounted in the groove 30 of the foam mount 26. The foam mount 26 is electrically non-conductive in order that only selected surface portions of the foam mount can be made electrically conductive by an application of an electrically conductive coating as discussed below. One of the drawbacks with using a foam mount having the above properties is that the foam mount is most likely translucent. More particularly, the foam mount transmits diffused visible light. As is appreciated by those skilled in the art, when the rays of the sun, or visible light beams are incident on the foam mount, the foam mount transmits diffused light, which can be disturbing to the passengers of the aircraft.

In the practice of the invention, the transmission of diffused visible light through the foam mount 26 is minimized or eliminated by applying a visible light blocking or opaque layer or coating 58 over selected surfaces of the frame mount 26 facing the exterior of the aircraft and expected to be exposed to solar energy and/or visible light before applying an electrical conductive layer or coating to the foam mount 26. In one non-limiting embodiment of the invention, the visible light blocking or opaque coating 58 (hereinafter for simplicity also referred to "blocking coating") is applied over or on the selected outer surface portions discussed above of a foam mount 26, e.g. but not limited to a Zote Foam mount made by Technifab, Inc. having an office in Avon, Ohio. An electrically conductive layer or coating 60 is applied over or on the blocking coating 58 and over or on inner walls 61 of the groove 30, the outboard side 50, and the outboard inner surface 42 of the foam mount 26, and a decorative coating 62, preferably a non-electric conductive coating, is applied over or on inboard inner surface 41 of the foam mount 26. Portions of the foam mount 26 under the decorative coating 62 and outer peripheral surface 64 of the foam mount 26 do not have to be coated with the blocking coating 58. Portions of the foam mount 26 under the decorative coating 62 do not have to be coated with the blocking coating 58 because the blocking coating under the electrically conductive coating 60 prevents or limits the amount of the visible light passing through the electrically conductive coating 60 from reaching the foam mount 26. The outer peripheral surface 64 of the foam mount 26 does not have to be coated with the decorative coating 62 and the blocking coating because the outer surface 64 of the foam mount 26 is not visible when viewing through the cabin window 24 and not coating the surface 64 realizes a reduction in the cost of the coatings.

Although not limiting to the invention, in the preferred practice of the invention, the blocking coating 58 is a black paint certified by the Federal Aviation Administration for use in the interior of an aircraft and sold by PPG Aerospace (PRC DeSoto) Paint No. CA 8412. The Paint No. CA 8412 is provided in a kit having dry black powder and a liquid solvent. The black powder and the solvent are mixed, and the coating mixture applied per the instructions provided with the kit over the foam mount surface. As can be appreciated, the paint can be applied in any usual manner, e.g. but not limited to application by brush, roller or spray equipment. The thickness of the blocking coating 58 is not limiting to the invention, however, in the preferred practice of the invention, the blocking coating 58 should not crack when the foam mount is flexed as discussed below.

As is appreciated by those skilled in the art, the thickness of the Paint No. CA 8412 is given in weight of cured paint per area. In one non-limiting embodiment of the invention, 2.5 to 3.5 grams of cured dry paint per 75.9 square inches was used. Although the visible light transmission of the coated area was not taken, it is expected that the transmission is in the range of zero to less than 15%.

For purposes of clarity, the ultraviolet wavelength range is 300 to 380 nanometers (hereinafter also referred to as "nm"); the visible wavelength range is greater than 380 to 770 nm; and the near infrared wavelength range is greater than 770 to 2500 nm; of the electromagnetic spectrum. As can be appreciated, the invention is not limited to the visible light transmission of the blocking coating 58, and in the practice of the invention, the visible light transmission of the blocking coating is less than the visible light transmission of the electrically conductive coating 60. In other non-limiting embodiments of the invention, the visible light transmission of the blocking coating is useable in the range of 0% to 40%; preferably in the range of 0% to 20%; more preferably in the range of 0% to 15% or 0% to 10%, and most preferably in the range of 0% to 1%.

As discussed above, the blocking coating 58 is applied over or on the outboard inner surface 42 and outboard sides 50, of the foam mount 26, which are outer surface portions of the foam mount facing the exterior of the aircraft and having visible light impinging thereon. In this manner, transmission of diffused visible light through the foam mount 26 is reduced if not eliminated. Although not limiting to the invention, the conductive coating 60 is applied on or over the blocking coating 58, e.g. over or on the outboard inner surface 42 and the outboard sides 50, and over or on the walls of the groove 30, of the foam mount 26 to prevent electronic signals from moving through the foam mount 26. The inboard inner surface 41 of the foam mount 26 is painted with the decorative paint 62 for aesthetic reasons. Although not all of the surfaces of the foam mount 26 are coated, e.g. the outer peripheral surface 64 of the foam mount 26 is not coated with the blocking coating 58, the invention contemplates coating all the surfaces of the foam mount 26 with the blocking coating 58.

With reference to FIG. 3, interface 63 is the end of the conducive layer 60 and the beginning of the decorative coating 62. As is appreciated, the invention is not limited to the location of the interface 63, however, the conducive layer 60 and the electrically conducive film 34 of the pane 28 should provide an RF shielding without any gaps or separations between the conductive layer 60 of the foam mount 26 and the electro conducive film 34 of the pane 28. Further, as is appreciated, the invention is not limited to the types of electrically conducive paint and decorative paint used in the practice of the invention. In one non-limiting embodiment of the invention, the electrically conducive coating 60 was 102-32/B507 Silver RF paint of the type sold by Creative Materials, and the decorative coating 62 was 1050 HF BAC70913 topcoat sold by HSH Interplan, Inc.

In one non-limiting embodiment of the invention, the foam mount 26 is coated in accordance to following PROCEDURE A.

Procedure A

1. HSH Interplan, Inc. FED non-crazed cleaner for composites is applied over the inboard inner surface 41 of the foam mount 26. The cleaner is applied with a lint free Kimberly-Clark WypAll L30 wipe followed by a stream of low pressure compressed air to remove lint and foreign particles from the foam mount.

2. PRC DeSoto Paint No. CA 8412 is prepared per instructions provided by the manufacturer of the paint to provide a cured weight of 3 grams per 75.9 square inches, and the paint is applied over the outboard inner surface 42 and the sides 50 of the foam mount 26.

3. The paint is cured per instructions provided by the manufacturer.

4. HSH Interplan, Inc. EED non-crazed cleaner for composites is applied to the inner rails 61 of the groove 30 of the foam mount 26. The cleaner is applied with a lint free Kimberly-Clark WypAll L30 wipe followed by a stream of low pressure compressed air to remove lint and foreign particles from the foam mount.

5. 102-32/B507 Silver RF paint (hereinafter also referred to as "Silver RF paint") is prepared per directions provided by the manufacturer of the Silver RF paint.

6. A paint stick or a swab is used to apply a layer 60 of the Silver RF paint to the inner walls 61 of the groove 30 of the foam mount 26 (see FIG. 3). Care is exercised not to apply any of the Silver RF paint to the inboard inner surface 41 of the foam mount 26.

7. The conductive layer 60 of the Silver RF paint applied over the inner walls 61 of the groove 30 is cured per instructions provided by the manufacturer of the Silver RF paint.

Figure 4:
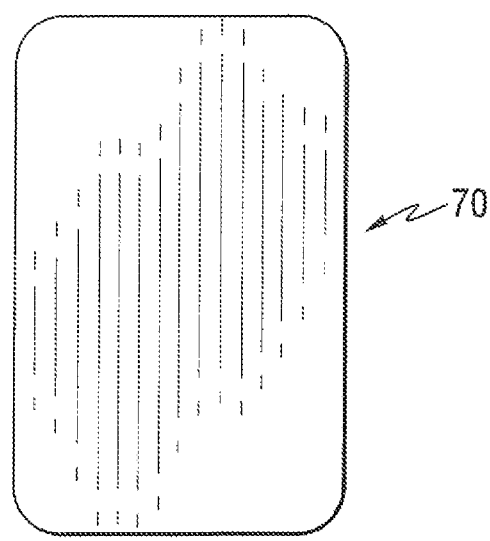
FIG. 4 is a plan elevated top view of a blank used in the practice of the invention to prevent coating overlap.

8. After the curing of the layer 60 of the Silver RF paint on the walls of the groove, a blank 70 (see FIG. 4) having a shape similar to the shape of the pane 28 to be mounted in the groove 30 is provided. In the non-limited embodiment of the invention under discussion, the blank is a cardboard blank, however, the invention is not limited thereto, and the blank can be made of any material, e.g. but not limited to wood, metal, glass or plastic. The thickness of the blank 70 is not limiting to the invention, and the thickness is preferably 80-90% of the thickness of the pane 28 to be mounted in the groove 30 of the foam mount 26 for the reason discussed below. As mentioned above, the blank 70 has a shape similar to the shape of the pane 28; however, in this non-limiting embodiment of the invention, the shape of the blank is 5-10% smaller than the shape of the pane 28 to be mounted in the groove 30. By providing a blank 70 that is thinner and smaller than the pane 28 to be mounted in the groove 30, the groove 30 of the foam mount 26 is not excessively flexed when the blank 70 is inserted in the groove 30 to partition the inboard inner surface 41, from the outboard inner surface 42, of the foam mount 26 to prevent coating overlap.

9. The layer 60 of the Silver RF paint is sprayed onto the outboard inner surface 42, and the outboard side 50, of the foam mount 26 (see FIG. 3). Care is taken not to spray the outer surface 64 of the foam mount; however, overspray of the Silver RF paint onto the outer peripheral surface 64 is expected and in this nonlimiting embodiment of the invention, overspray of the Silver RF paint onto the outer surface 64 is acceptable.

10. The layer 60 of the Silver RF paint on the outboard inner surface 42, and the outboard side 50, of the foam mount 26 is cured per directions provided by the manufacturer of the Silver RF paint. The blank 70 remains in the groove 30 of the foam mount during the curing of the Silver RF paint.

11. After the curing of the conductive layer 60 of the Silver RF paint on the outboard inner surface 42, and the outboard side 50, of the foam mount 26 is completed, the inboard inner surface 41 of the foam mount 26 is cleaned using HSH Interplan, Inc. EED cleaner.

12. Thereafter, HSH Interplan, Inc. 1025 primer/sealer is painted on the inboard inner surface 41 of the foam mount 26. The sealer is cured in one of the following manners: heated at 95 degrees Fahrenheit for 15 minutes or cured at room temperature for one hour.

13. After the sealer is cured, the layer 62 of the decorative paint is sprayed over the sealer. Care was taken not to spay the sealer or the decorative paint on the outer peripheral surface 64 of the foam mount 26; however, overspray of the sealer and the decorative paint onto the outer peripheral surface 64 was noted. In this non-limiting embodiment of the invention, overspray of the sealer and the decorative paint onto the outer surface 64 of the foam mount 26 is expected and for this non-limited embodiment of the invention is acceptable.

14. The layer 62 of the decorative paint on the inboard inner surface 41 of the foam mount 26 is cured per directions provided by the manufacturer of the decorative paint to provide a coated foam mount of the invention.

15. The blank 70 is removed from the foam mount 26.

The blocking coating 58 applied over or on the outboard inner surface 42 and outboard sides 50, of the foam mount 26, which are outer surface portions of the foam mount facing the exterior of the aircraft and having visible light impinging thereon blocks more than 90%, if not all, of the visible light impinging on the foam mount from passing through the foam mount 26.

The term "overspray" as used herein is defined as a coating or layer having a decreasing thickness as the distance from the coating area increases. In the practice of the invention, the overspray of the Silver RF paint has a thickness that decreases as the distance from the intersection of the outboard side 50, and the outer peripheral surface 64, of the foam mount 26 increases (see FIG. 3), and the overspray of the Silver RF paint terminates short of the intersection of the inboard side 44, and the outer surface 64, of the foam mount 26. The overspray of the decorative paint 62 has a thickness that decreases as the distance from the intersection of the inboard side 44, and the outer surface 64, of the foam mount 26 increases (see FIG. 3), and the overspray of the decorative paint terminates short of the intersection of the outboard side 50, and the outer peripheral surface 64, of the foam mount 26. Further, the overspray of the decorative coating 62 and the overspray of Silver RF coating 60 preferably do not overlap.

The conductive layer 60 on the foam mount 26 is electrically connected with the aircraft body 52 to connect the electric conductive layer 60 of the foam mount 26 to the electric ground of the aircraft 22. With this arrangement, the pane 28 mounted in the groove 30, and the electric conductive layer 60, of the foam mount 26 provide an RF shielding over the window opening in the body of the aircraft. Covering the inner walls 61 of the groove 30 of the foam mount 26 with the conductive layer 60 assures that there is no break in the RF shield provided by the electrodes 32 and 33 of the pane 28 and the electric conductive layer 60 of the foam mount 26. With reference to FIG. 2, wires 72 contacting the electrodes 32 and 33 of the pane 28 and wire 74 contacting the Silver RF paint 60 were arranged in groove 76 (see FIGS. 2 and 3) in the outboard side 50 of the foam mount 26 to meet at tab 78 formed on outer surface 64 of the foam mount 26. The wires were provided with connectors (not shown) to connect to the electro chromic window 28 and the layer 60 of the Silver RF paint to the electrical system of the aircraft 22.

As can now be appreciated, the practice of Process A does not provide for the prevention of overspray of the conductive coating 60 and the decorative coating 62 onto the outer peripheral surface 64, and the inboard side 44, of the foam mount 26 (see FIG. 3). The invention contemplates preventing the painting or covering of the outer peripheral surface 64, and/or the inboard side 44, of the foam mount 26 with the electric conductive layer 60 and the decorative paint layer 62, respectively. In another non-limiting embodiment of the invention, the decorative coating 62 and the electrically conductive coating 60 is applied with a paint brush or with a paint roller to prevent the covering of the outer peripheral surface 64, and the inboard side 44, of the foam mount 26. In another non-limiting embodiment of the invention, the foam mount 26 is positioned in a mask designed to prevent or minimize the covering of the outer surface 64, and/or the inboard side 44, of the foam mount 26 with the conductive coating 60 and the decorative coating 62, respectively.

Figure 5:
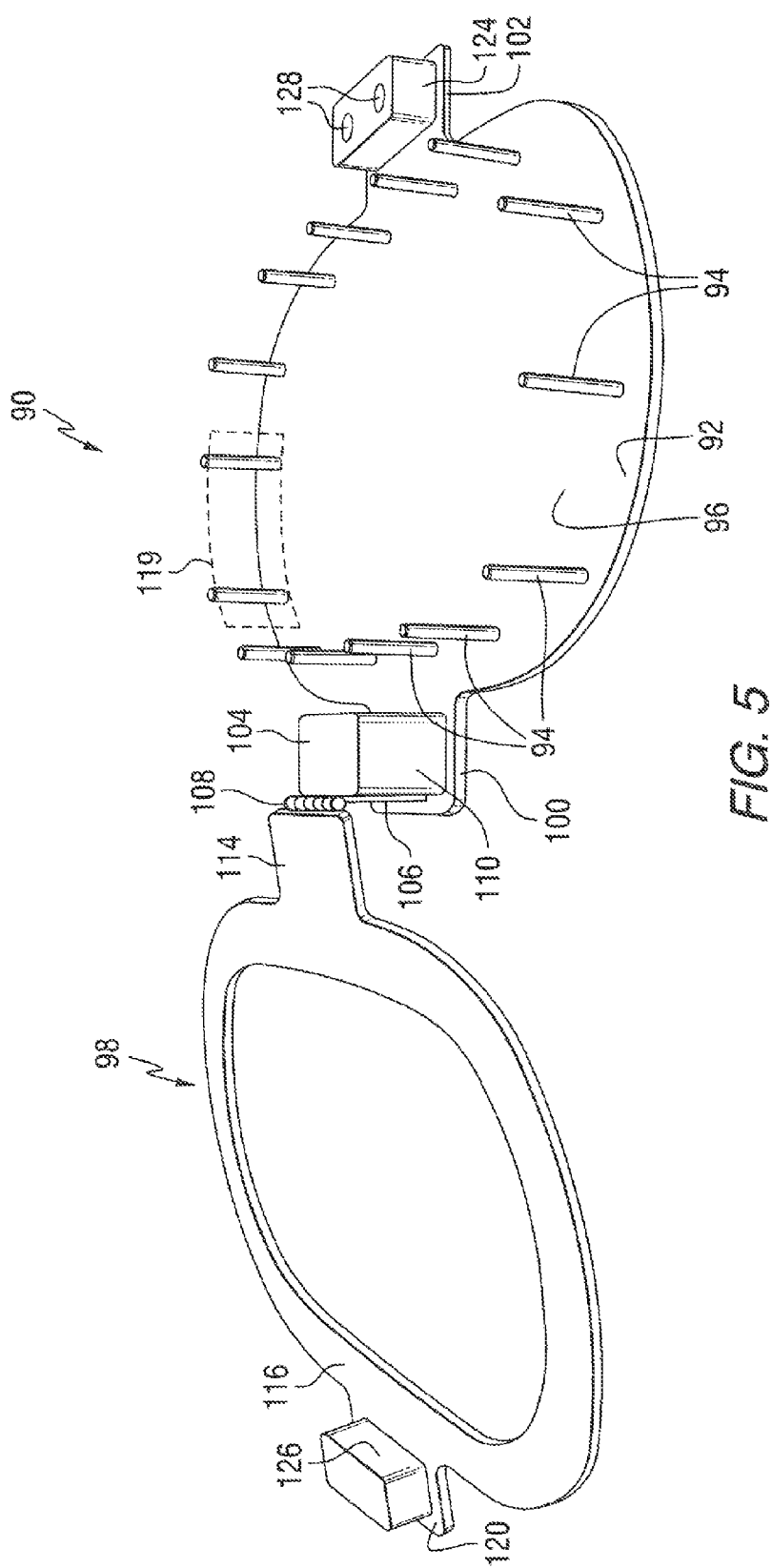
FIG. 5 is a prospective view of a mask in the open position; the mask can be used in the practice of the invention to prevent coating overlap.
Figure 6:
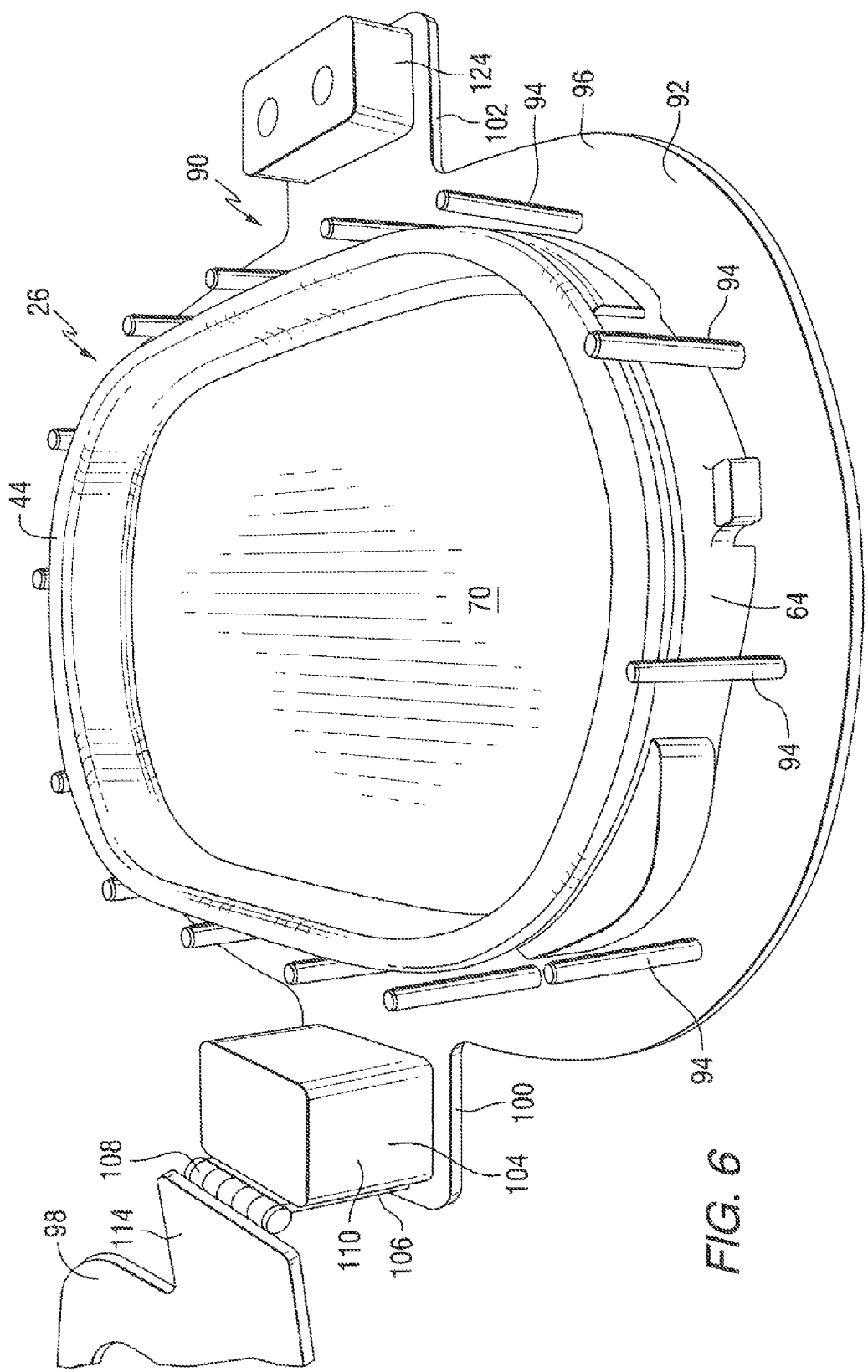
FIG. 6 is a view similar to the view of FIG. 5 showing a foam mount positioned on the base of the mask.

With reference to FIG. 5, there is shown a non-limiting embodiment of a mask 90 of the invention to prevent or minimize the covering of the outer peripheral surface 64, and/or the inboard side 44, of the foam mount 26 with the conductive coating 60 and/or the decorative coating 62, respectively. The coating mask 90 includes a base 92 having a plurality of spaced upright pins 94 secured on the base 92 in any convenient manner, and positioned on the base 92 to contain the foam mount 26 as shown in FIG. 6 and to prevent sideway motion of the foam mount 26 without compressing the outer peripheral surface 64 of the foam mount 26. The height of the pins 94 as measured from surface 96 of the base 92 of the mask 90 is equal to, or slightly greater, e.g. greater than 0 to 10% greater than the thickness of the foam mount 26 as measured between the outboard side 50 and the inboard side 44 (see FIG. 3) to avoid compression of the foam mount 26 when the mask cover 98 is positioned over the foam mount 26 and engages the pins 94. As can be appreciated, as the percent difference between the height of the pins 92 and the thickness of the foam mount 26 increases, the greater the probably of over spray of the conductive coating 60 and the decorative coating 62 passing through the space between the mask cover 98 and the foam mount 26, and depositing over the outer surface 64, and/or the inboard side 44, of the foam mount 26.

Figure 7:
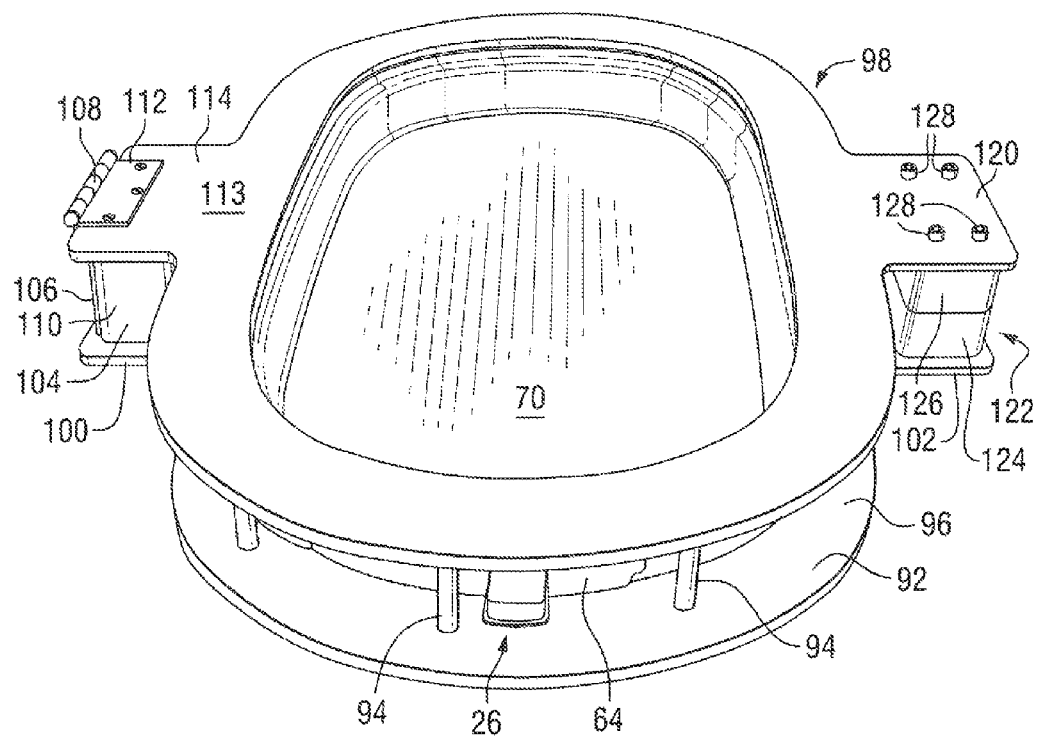
FIG. 7 is a view similar to the view of FIG. 6 showing the mask in the closed position.

With continued reference to FIG. 5, the base (hereinafter also referred to as the "mask base") 92 includes support plates 100 and 102. A shim 104 is secured to the support plate 100 in any convenient manner, e.g. by screws or welding. One plate 106 of a hinge 108 is secured to side 110 of the shim 104, and the other plate 112 of the hinge 108 is secured to outer surface 113 of the mask cover 98 at hinge support 114 (clearly shown in FIG. 7) so that inner surface 116 of the mask cover 98 and the surface 96 of the mask base 92 can be pivoted toward and away from one another to position the inner surface 116 of the mask cover 98 on the pins 94 (the mask cover 98 in the closed position as shown in FIG. 7), and to move the inner surface 116 of the mask cover 98 away from the pins 94 toward the open position (mask cover 98 shown in the open position in FIGS. 5 and 6). Preferably, but not limiting to the invention, the thickness of the shim 104 as measured between the inner surface 116 of the mask cover 98 and the surface 96 of the mask base 92 is equal to the height of the pins 94. As is appreciated, the invention contemplates a solid endless or continuous wall in place of the pins 94. A segment of the solid continuous wall 119 is shown only in FIG. 5 and shown only in phantom.

With reference to FIG. 8, in one non-limiting embodiment of the invention, one mask cover 98A is provided with a cut out center portion 120 sized such that with the mask 90 in the closed position, the inner surface 116 of the mask cover 98A overlays the inboard side 44 of the foam mount 26. With reference to FIG. 9, in the non-limiting embodiment of the invention under discussion, another mask cover 98B is provided with a cut out center portion 120 sized such that with the mask 90 in the closed position, the inner surface 116 of the mask cover 98B overlays the outboard side 50 of the foam mount 26 adjacent the intersection of the outboard side 50, and the outer surface 64, of the foam mount 26 as shown in FIG. 9. As can be appreciated, when the cut out portions 120 are the same size, one size mask cover 98 can be used in the practice of the invention.

With reference to FIGS. 5-7 as needed, the mask cover 98 further includes a fastener support 120 that is aligned with the support 102 of the base 92 when the mask cover 98 is in the closed position (see FIG. 7). The mask cover 98 is preferably maintained in the closed position when the mask 90 is moved into and out of a coating curing chamber (not shown). The invention is not limited to the type of fastener 122 used in the practice of the invention to maintain the mask in the closed position. In one non-limiting embodiment of the invention, the fastener was a magnetic fastener 122 having magnetic bar 124 secured to the support plate 102 of the base 92 of the mask 90, and a magnetic bar 126 secured to fastener support 120 of the mask cover 98. In one non-limiting embodiment of the invention, the positive side of the magnetic bar 124 faces the magnetic bar 126, and the negative surface of the magnetic bar 126 faces the magnetic bar 124, The magnetic bars are secured to their respective support in any convenient manner, e.g. by screws 128 (see FIGS. 6 and 7). The thickness of the magnetic bars 124 and 126 as measured between the surface 96 of the mask base 92 and the inner surface 116 of the mask cover 98 is equal to the thickness of the shim 104, or the height of the pins 94.

In another non-limiting embodiment of the invention, the mask 90 is used to apply the conductive layer 60 and the decorative layer 62 to selected portions of the foam mount 26 in the manner described in PROCEDURE B.

Procedure B

A. Steps 1-8 of PROCEDURE A were practiced.

B. The foam mount 26 having the blank 70 is placed within the upright pins 94 of the mask 90 (see FIG. 6) with the inboard side 44 of the foam mount 26 on the surface 96 of the base 92 of the mask 90. The mask cover 98B is positioned in the closed position such that the mask cover 98B overlaid a portion of the outboard side 50 of the foam mount 26 adjacent the intersection of the outboard side 50, and the outer surface 64, of the foam mount 26 (see FIG. 9).

C. The layer 60 of the Silver RF paint is sprayed onto the outboard inner surface 42, and the uncovered portion of the outboard side 50 of the foam mount 26 (see FIG. 9).

D. The layer 60 of the Silver RF paint on the outboard inner surface 42, and the outboard side 50, of the foam mount 26 is cured per directions provided by the manufacturer of the Silver RF paint. The blank 70 remained in the groove 30 of the foam mount during the curing of the Silver RF paint.

E. Step 11 of PROCEDURE A is practiced.

F. The foam mount 26 having the blank 70 is placed within the pins 94 of the mask 90 (see FIG. 6) with the outboard side 60 of the foam mount 26 on the surface 96 of the base 92 of the mask 90. The mask cover 98A is positioned in the closed position such that the mask cover 98A overlaid the inboard side 44 of the foam mount 26 (see FIG. 8).

G. Step 12 of PROCEDURE A is practiced.

H. After the sealer is cured, the layer 62 of the decorative paint was sprayed over the sealer to apply the decorative paint over the inboard inner surface 38 of the foam mount 26.

I. Steps 14 and 15 of PROCEDURE A were practiced.

After the blank 70 is removed from the foam mount, the pane 28 mounted in the groove 30 of the foam mount, as previously discussed.

In another non-limiting embodiment of the invention, the mask 90 is used to apply the blocking coating 58, the conductive layer 60 and the decorative layer 62 to selected portions of the foam mount 26 in the manner described in PROCEDURE C.

Procedure C i. Step 1 of PROCEDURE A is practiced.

ii. Step 8 of PROCEDURE A is practiced.

iii. Step B of PROCEDURE B is practiced iv. Steps 2 and 3 of PROCEDURE A are practiced.

v. The foam mount is removed from the mask 90 and the blank 70 removed from the foam mount 26.

vi. Steps 4-8 of PROCEDURE A are practiced.

vii. Steps B-I of PROCEDURE B are practiced.

After the blank 70 is removed from the foam mount and the pane 28 mounted in the groove 30 of the foam mount, as previously discussed.

The invention was practiced to coat the foam mount 26 in the following manner using PROCEDURE B. A foam mount 26 was weighed and the weight recorded. Step A of PROCEDURE B was practiced. The foam mount having the cured opaque coating was weighed, and the weight of the foam mount before painting subtracted from the weight of the foam mount after the opaque coating was applied to provide a cured opaque coating weight of 3 grams per 75.9 square inches. Although not limiting to the invention, it is preferred to spray 3 grams or less because additional spraying of the opaque coating can be practiced to increase the coating weight, however, if the 3 grams is exceeded, it is difficult to remove the cured opaque coating. After the foam mount 28 having the opaque coating had an acceptable weight of 3 grams per 75.9 square inches, Steps B through I were practiced. Although the visible light transmission of the coated area was not taken, it is expected that the transmission was in the range of zero to less than 15%.

As can now be appreciated, the mask cover 98A prevents overspray of the sealer, and/or the decorative coating 62 over the outer surface 64, and the outer surface 64, of the foam mount 26, and the mask cover 98B prevents overspray of the visible light blocking coating 58, and/or the conductive coating 60 over the outer surface 64 of the foam mount 26. As is further appreciated, the invention is not limited to the sequence in which the inboard surfaces 44 and 50 of the foam mount 26 are painted, and the steps can be interchanged, e.g. but not limiting to the discussion the decorative coating can be applied before the visible light blocking coating 58 and/or the conductive coating 62 is applied.

It is readily appreciated by those skilled in the art that modifications can be made to the non-limiting embodiments of the invention discussed above without departing from the concepts disclosed in the foregoing description. Further, it is understood that various changes can be made without departing from the spirit of the invention as defined by the claimed subject matter which follows.

What is claimed is:

1. A foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end and the open end of the groove faces the open area of the foam mount, and the first inner surface and the first side is on one side of the open end of the groove and the second inner surface and the second side is on the other side of the open end of the groove, the foam mount comprising:

a coating over selected surfaces of the foam mount, wherein the coating has a visible light transmission of less than 40%, and the selected surfaces of the foam mount comprises at least the first inner surface of the foam mount, and an electric conductive coating over inner surfaces of the groove.

2. The foam mount according to claim 1 wherein the coating has a visible transmission in the range of zero percent to 15%.

3. A foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end and the open end of the groove faces the open area of the foam mount, and the first inner surface and the first side is on one side of the open end of the groove and the second inner surface and the second side is on the other side of the open end of the groove, the foam mount comprising:

a coating over selected surfaces of the foam mount, wherein the coating has a visible light transmission of less than 40%, and the selected surfaces of the foam mount comprise at least the first inner surface of the foam mount, and an electric conductive coating over walls of the groove and over the first inner surface and the first side of the foam mount.

4. The foam mount according to claim 3 comprising a non-electric coating over the second inner surface and the second side of the foam mount.

5. The method according to claim 3 wherein the visible light blocking coating has a visible light transmission of less than 15%.

6. The method according to claim 5 wherein the visible light blocking coating has a visible light transmission of less than 1%.

7. A radio frequency (hereinafter designated as "RF") shielded window comprising:

a foam mount in a shape having an enclosed frame surrounding an open area, the frame in cross section having a peripheral surface;

an inside surface opposite to the peripheral surface, wherein the inside surface defines the open area and the inside surface of the foam mount includes a groove having an open end and the open end of the groove facing the open area of the foam mount; a first side of the foam mount extending from the peripheral surface to a first inner surface, and an opposite second side of the foam mount extending from the peripheral surface to a second inner surface, wherein the first inner surface and the first side are on one side of the open end of the groove and the second inner surface and the second side is on the other side of the open end of the groove;

a visible light blocking coating over selected surfaces of the foam mount, wherein the visible light blocking coating has a visible light transmission of less than 40%, and the selected surfaces of the foam mount comprise at least the first inner surface, and the first side, of the foam mount;

an electric conductive coating over selected portions of the visible light blocking coating and over the inner walls of the groove;

a non-electric conductive coating over the second side and the second inner surface of the foam mount, and a window having a radio frequency shielding electrically conductive coating defined as an RF coating over a major surface, wherein marginal edges of the window are in the groove with the RF coating of the window in electrical contact with the electric conductive coating in the groove.

8. The RE shielded window according to claim 7 wherein the foam mount is a foam mount for an aircraft window, and the visible transmission is in the range of zero percent to 15%.

9. The RE shielded window according to claim 8 wherein the visible light blocking coating is a black paint.

10. The RE shielded window according to claim 9, wherein the window is an aircraft cabin window and the visible light blocking coating comprises 2.5 to 3.5 grams of cured dry paint per 75.9 square inches of surface areas coated.

11. The method according to claim 8 wherein the visible light blocking coating has a visible light transmission of less than 15%.

12. The method according to claim 11 wherein the visible light blocking coating has a visible light transmission of less than 1%.

13. A method of coating a foam mount, the foam mount in a shape having an enclosed frame surrounding an open area, the frame in cross section having peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end and the open end of the groove faces the open area of the foam mount, and the first inner surface and the first side are on one side of the open end of the groove and the second inner surface and the second side are on the other side of the open end of the groove, comprising;

applying a visible fight blocking coating over selected surfaces of the foam mount, wherein the coating has a visible light transmission of less than 15%, and the selected surfaces comprise at least the first inner surface of the foam mount, and applying an electric conductive coating over the inner surfaces of the groove.

14. A The method of coating a foam mount, the foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes a groove having an open end and the open end of the groove faces the open area of the foam mount, and the first inner surface and the first side are on one side of the open end of the groove and the second inner surface and the second side are on the other side of the open end of the groove, comprising:

applying a visible blocking coating over selected surfaces of the foam mount, wherein the coating has a visible light transmission of less than 40%, and the selected surfaces comprise at least the first inner surface of the foam mount, and applying an electric conductive coating to the walls of the groove;

inserting peripheral edge of a blank in the groove to completely cover the open area of the foam mount to separate the foam mount into a first section and a second section, wherein the first section comprises the first side and the first inner surface, and the second half comprises the second side, and the second inner surface;

applying a second electric conductive coating over the first section, wherein the coating on first section and the coating on the inner surface of the groove contact one another, and applying a non-electric conductive coating over the second section of the foam mount.

15. The method according to claim 14 wherein after applying the visible light blocking coating, the visible light blocking coating is cured or dried; after applying the first electric conductive coating over the inner surface of the groove, the electric conductive coating is dried or cured; after applying the second electric conductive coating over the first section, the electric conductive coating is dried or cured, and after applying the non-electric conductive coating over the second section, the non-electric conductive coating is dried or cured.

16. The method according to claim 14 wherein the first and the second electric conductive coatings have the same composition.

17. The method according to claim 14 wherein the first electric conductive coating is applied over the inner surfaces of the groove by a stick or brush; the second electric conductive coating is sprayed over the first section, and the non-electric conductive coating is sprayed over the second section, wherein a portion of the spray of second electric conductive coating is sprayed over a first portion of the peripheral surface, and a portion of the non-electric conductive coating is sprayed over a second portion of the peripheral surface.

18. The method according to claim 14 further comprising: providing first and second coating masks, each of the coating masks comprising a base, an upright wall having a height equal to the thickness of the foam mount as measured at the peripheral surface of the foam mount and the upright wall having a perimeter as measured around inside surface of the wall equal to the perimeter of the foam mount, and a cover pivotally mounted to move in a first direction to a closed position, wherein the cover in the closed position is over the base, and to move in an opposite second direction to an open position, wherein the cover of the first mask has an opening to expose the first section of the foam mount and cover the peripheral surface of the foam mount, and the cover of the second mask has an opening to expose the second section of the foam mount and cover the peripheral surface; after the blank is inserted in the groove, the foam mount is placed within the wall of the first mask with the foam mount on the base of the first mask and the second section of the foam mount in facing relationship to the base of the first mask; moving the cover of the first mask to the dosed position; practicing the applying the electric conductive coating; prior to the applying the non-electric coating, removing the foam mount from the wall of the first mask; placing the foam mount within the wall of the second mask with the first section having the electric conductive coating facing the base of the second mask; moving the cover of the second mask to the closed position, and practicing the applying the non-electric conductive coating.

19. The method according to claim 14 wherein the visible light blocking coating has a visible light transmission in the range of zero to 15%.

20. A method of making an RF shielded aircraft window, comprising:
providing a foam mount, the foam mount in a shape having an enclosed frame surrounding an open area, the frame in cross section having a peripheral surface; an inside surface opposite to the peripheral surface, the inside surface defining the open area; a first side extending from the peripheral surface to a first inner surface, and an opposite second side extending from the peripheral surface to a second inner surface, wherein the inside surface of the foam mount includes open end of a groove facing the open area of the foam mount and the first inner surface is on one side of the open end of the groove and the second inner surface is on the other side of the open end of the groove;
providing a transparency having an RF shielding layer over a major surface of the transparency, the transparency shaped and sized to fit within the groove of the foam mount and completely cover the open area of the foam mount;
providing a blank having a peripheral shape similar to peripheral shape of the transparency;
applying a visible light blocking coating over selected surfaces of the foam mount, wherein the blocking coating has a visible light transmission of less than 40%, and the selected surfaces comprise at least the first inner surface and the first side, of the foam mount;
after applying the visible light blocking coating to the foam mount;
applying a first electric conductive coating over inner surface of the groove;
inserting peripheral edge of the blank in the groove to completely cover the open area of the foam mount to separate the foam mount into a first section and a second section, wherein the first section comprises the first side and the first inner surface, and the second section comprises the second side and the second inner surface;
applying a second electric conductive coating over the first section, wherein the second electric conductive coating on the first section of the foam mount and the first coating on the inner surface of the groove contact one another;
applying a non-electric conductive coating over the second section of the foam mount;
removing the blank from the foam mount, and
placing the transparency in the groove of foam mount.

21. The method according to claim 20 wherein after applying the visible light blocking coating, the visible light blocking coating is cured or dried; after applying the first electric conductive coating over the inner surfaces of the groove, the electric conductive coating is cured or dried; after applying the second electric conductive coating over the first section, the electric conductive coating is cured or dried, and after applying the no electric conductive coating over the second section, the non-electric conductive coating is cured or dried.

22. The method according to claim 20 wherein the blocking coating has a visible light transmission in the range of zero to 15%.

23. The method according to claim 20 wherein the second electric conductive coating sprayed onto the first portion of the peripheral surface of the foam mount is spaced from the portion of the non-electric conductive coating sprayed onto the second portion of the peripheral surface.

24. The method according to claim 20 further comprising: providing first and second coating masks, each of the coating masks comprising a base, an upright wall having a height equal to the thickness of the foam mount as measured at the peripheral surface of the foam mount and the upright wall having a perimeter as measured around inside surface of the wall equal to the perimeter of the foam mount, and a cover pivotally mounted to move in a first direction to a closed position, wherein the cover in the closed position is over the base, and to move in an opposite second direction to an open position, wherein the cover of the first mask has an opening to expose the first section of the foam mount and cover the peripheral surface of the foam mount, and the cover of the second mask has an opening to expose the second section of the foam mount and cover the peripheral surface of the foam mount; after the substrate is inserted in the groove, placing the foam mount within the wall of the first mask with the foam mount on the base and the second section of the foam mount in facing relation to the base of the first mask; moving the cover of the first mask to the closed position; practicing the applying the electric conductive coating; prior to the applying the non-electric coating, removing the foam mount from the wall of the first mask; placing the foam mount within the wall of the second mask with the first section of the foam mount facing the base of the second mask; moving the cover of the second mask to the closed position, and practicing the applying the non-electric conductive coating.

25. The method according to claim 20 wherein the window is selected from one of the following windows (1) an electrochromic window and the conductive coating is an electrode of the electrochromic window, and (2) a transparent substrate having an RF shielding electro conductive coating on a major surface of the transparent substrate.

* * * * *